Dec. 12, 1967 R. E. HULL 3,358,241

AMPLIFIER WITH SINGLE TIME DELAY TRANSFER CHARACTERISTIC AND CURRENT LIMIT PROTECTION

Filed Sept. 25, 1964 2 Sheets-Sheet 1

INVENTOR

Robert E. Hull

BY Clement J. Poznokas

ATTORNEY

Dec. 12, 1967 R. E. HULL 3,358,241

AMPLIFIER WITH SINGLE TIME DELAY TRANSFER CHARACTERISTIC AND CURRENT LIMIT PROTECTION

Filed Sept. 25, 1964 2 Sheets-Sheet 2

United States Patent Office 3,358,241

Patented Dec. 12, 1967

3,358,241

AMPLIFIER WITH SINGLE TIME DELAY TRANSFER CHARACTERISTIC AND CURRENT LIMIT PROTECTION

Robert E. Hull, Amherst, Buffalo, N.Y., assignor to Westinghouse Electric Corporation, East Pittsburgh, Pa., a corporation of Pennsylvania Filed Sept. 25, 1964, Ser. No. 399,230

17 Claims. (Cl. 330—15)

ABSTRACT OF THE DISCLOSURE

The apparatus shown is an amplifier with cascaded first and second amplifying sections, the first section having a transfer characteristic with lead and lag components, the second section having a characteristic with a lag component that cancels the lead component of the first section, thereby providing a composite transfer characteristic having a single lag or the characteristic of a single time delay. The second amplifying section includes a final stage with current limit protection.

Figure 1:
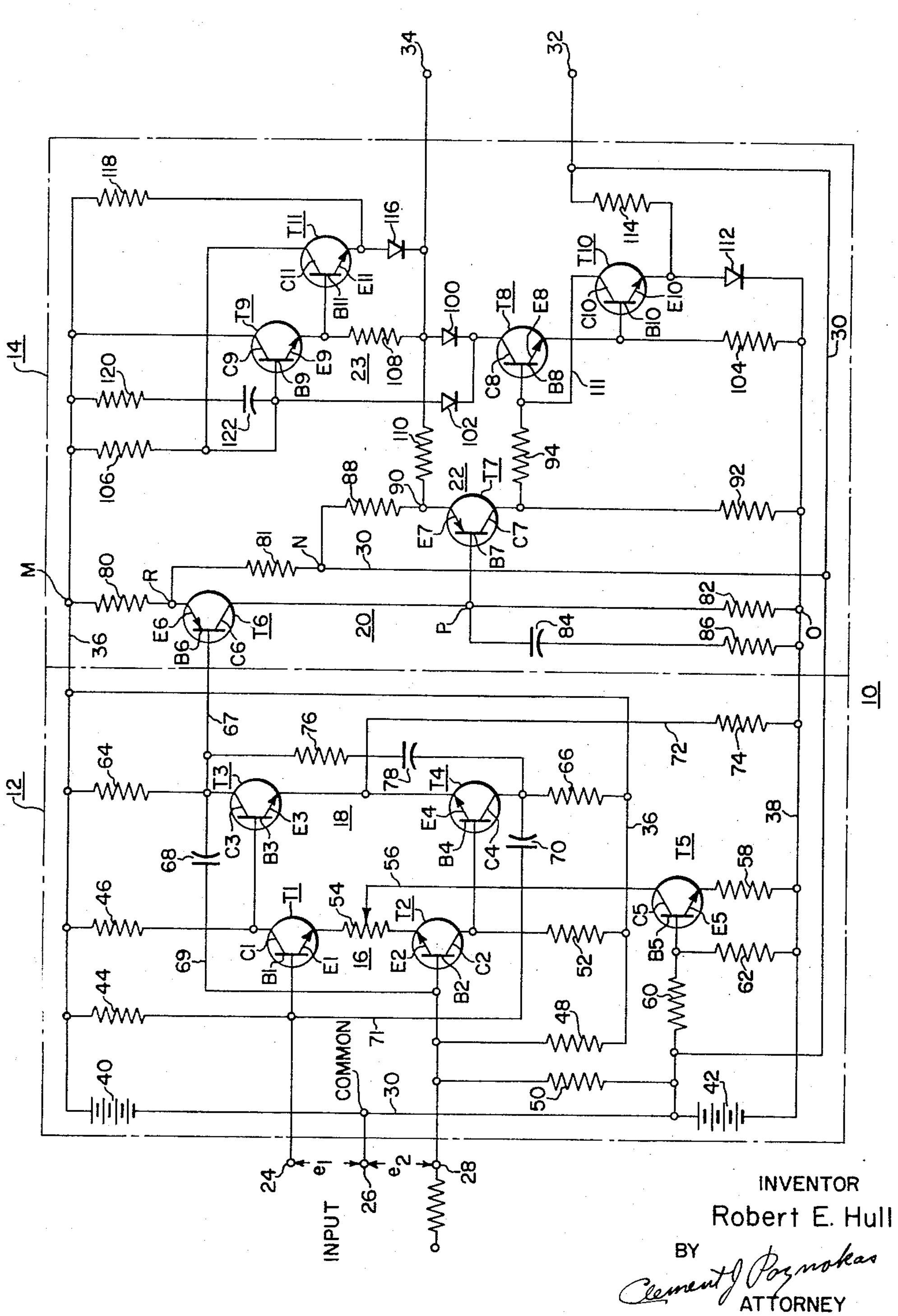

This invention relates to amplifiers which, while not limited thereto, are useful in operational amplifiers. More particularly, the invention is directed to amplifier transfer characteristic shaping, high efficiency amplifier circuit configuration, and to current limit protection of an amplifier.

While operational amplifiers are best known for their use in analog computers, they are also widely used for instrumentation and in control and regulating systems, especially in feedback type control systems. Operational amplifiers are used to perform the basic mathematical operations of addition, subtraction, differentiation, integration, etc. These operations are obtained through well known techniques involving the use of passive circuit elements, generally resistors and capacitors, in input and feedback networks in association with a high-gain DC (direct current) amplifier to obtain the desired transfer characteristic.

For use as an operational amplifier, a DC amplifier should have a low drift and a high DC gain to provide accurancy when used in the operational amplifier. Accuracy should be maintained over the operating range of frequencies. Thus a wide band-pass is desirable, for example, 10,000 c.p.s. (cycles per second) when connected in an operational amplifier for a gain of one using input and feedback resistors of 100,000 ohms. Additionally, it is desirable that the DC amplifier gain-frequency product should be high, for example, at least 250,000 (gain equals one at 250 KC). In such cases the gain should attenuate with frequency at 20 db/decade, crossing zero-db at 250 kc. or more, as may be expressed in a Bode plot which plots gain in db (decibels) versus frequency (cycles/second) along logarithmic scales. In other words, the DC amplifier should have the transfer characteristic of a single time delay having a maximum phase shift not exceeding 90°. These characteristics should hold true over a frequency range well exceeding the frequency at which the gain reduces to one. These characteristics are important in order to provide proper closed loop stability for all conditions of feedback impedance.

The above desired characteristics have heretofore been obtainable but at relatively high cost. Also, in prior art amplifiers break points of the transfer characteristic (Bode plot) are dependent on or affected in a major way by the active element parameters (transistors, etc.). In prior art amplifiers stabilizing circuits were added or altered after the feedback circuit was selected in order to stabilize the operational amplifier.

In a copending U.S. patent application (now Patent No. 3,327,235), Ser. No. 370,840, filed May 28, 1964, by the applicant herein and assigned to the same assignee, there is disclosed an amplifier having desirable attributes for use as an operational amplifier. The amplifier disclosed and claimed in the aforesaid copending application includes a first amplifying section driving in cascade a second amplifying section, the first having a transfer characteristic having lead and lag components, and the second having a characteristic with a lag component which substantially cancels the lead component of the first amplifying section, thereby providing a composite transfer characteristic having a single lag or the characteristic of a single time delay. The present invention is an improvement over the aforesaid copending disclosure in that it contemplates a high efficiency final amplifier stage which, despite its high efficiency, has a flat response through the operating frequency range without introducing appreciable phase shift. Another aspect of the present invention provides current limit protection to the output valve in case of accidental short circuit across the amplifier output circuit.

In accordance with one embodiment of the invention, an amplifier section, which is not limited to but is especially useful as an output stage cascaded behind the aforesaid first amplifying section described herein and also disclosed in the aforesaid copending application, is provided with a signal responsive input valve that is connected in one leg of a bridge and controls the output of the bridge to drive a second valve that drives a third valve, which provides the amplifier output. Constant gain controllable in design is provided by a negative feedback circuit wherein a tap on a voltage divider connected across the amplifier output circuit is connected to a power electrode of the second valve (for example the emitter of a transistor). The third valve is protected against accidental short circuit of the output circuit by a current limit arrangement wherein a normally cut off fourth valve, whose output is connected to the input of the third valve in negative feedback relation, is driven into conduction in response to excess current through the third valve, thereby driving the third valve down to the desired upper current limit.

It is therefore an object of the present invention to provide a new and improved DC amplifier having characteristics making it desirable for use as an operational amplifier.

Another object of the invention is to provide a new and improved DC amplifier having a high efficiency output stage and whose transfer characteristic is generally shaped independently of the active element parameters and whose break points are substantially only a function of passive element parameters.

Another object is to provide a new and improved amplifier with a high efficiency output stage, which amplifier for any feedback circuit selected for operational use will be stable without requiring further addition or modification of the amplifier itself.

Another object is to provide a high efficiency novel amplifier circuit configuration.

Another object is to provide such an amplifier having substantially constant gain which is governed substantially solely by passive elements in a novel negative feedback arrangement.

Still another object of the invention is to provide a novel amplifier having a current limit circuit in the output which prevents damage to the amplifier when the output is accidentally short circuited.

A further object of the present invention is to provide a relatively simple and economical DC amplifier having any or all of the heretofore discussed desirable features.

Yet another object is to provide a DC amplifier wherein the aforesaid desirable characteristics are obtainable at relatively low cost.

Other and further objects and advantages of the present invention will become evident from the following detailed description taken in connection with the drawings wherein a preferred embodiment of the invention is illustrated.

Figure 2:
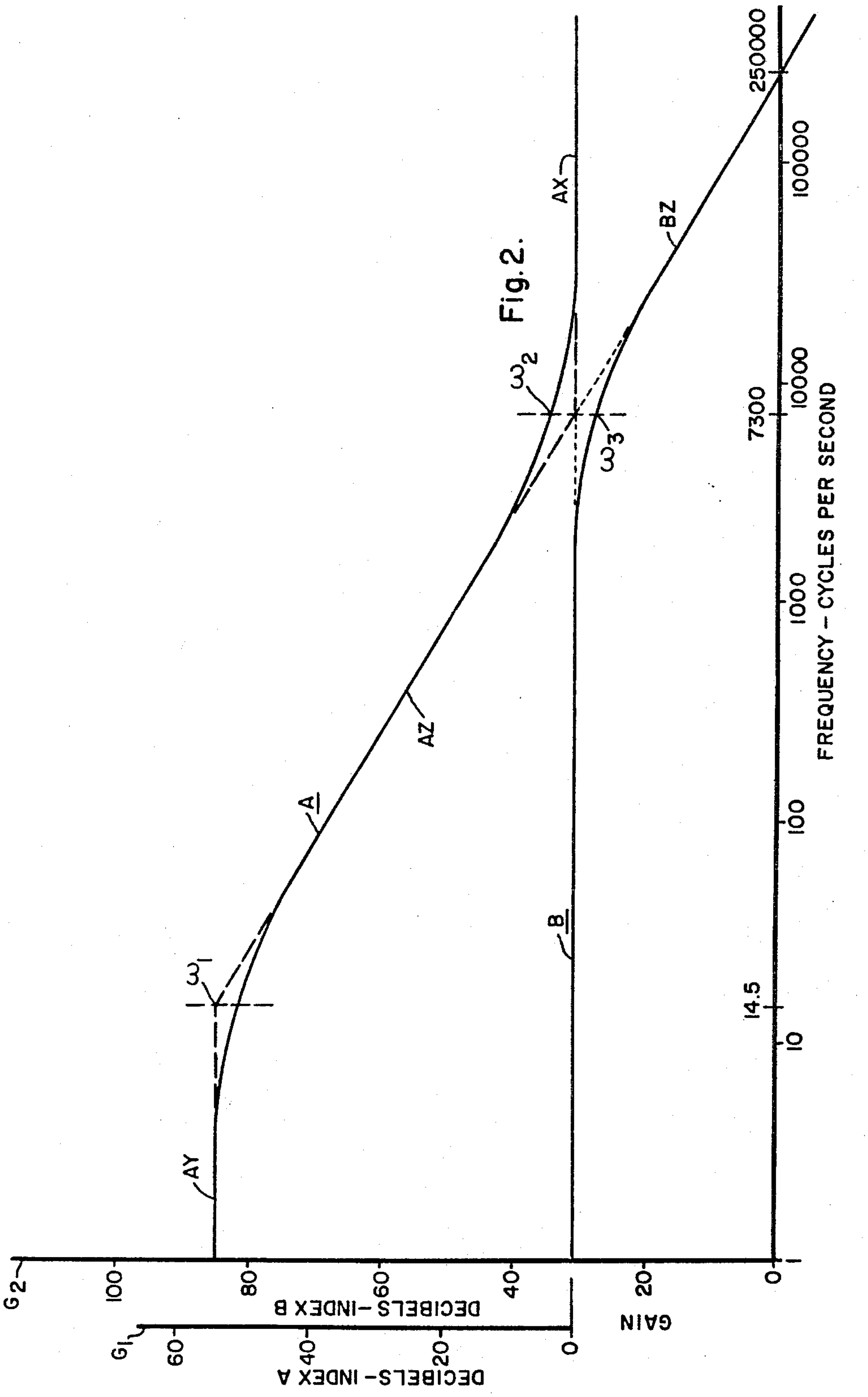

In the drawings:

FIGURE 1 is a schematic diagram of a DC amplifier embodying features of the invention; and FIG. 2 is a graph showing a Bode plot illustrating characteristics of the circuit of FIG. 1.

Referring now to FIGURE 1, there is shown a DC amplifier 10 including cascaded amplifying sections 12 and 14. The section 12 has first and second cascaded differential amplifier stages 16 and 18. Section 14 has three cascaded stages 20, 22 and 23. The inputs to amplifier 10 are at terminals 24–26 and at terminals 28–26. Terminal 26 is connected to a common line 30 that is connected to an output terminal 32 of the amplifier 10. The other output terminal of amplifier 10 is at 34. Amplifier stages 16 and 23 are respectively the input and output stages of amplifier 10. The output of amplifier 10 is responsive to and a function of the difference between the voltage $e_1$ at input terminal 24 (as related to common terminal 26) and the voltage $e_2$ at input terminal 26 (as related to common terminal 26).

Line 30 is the common for the power supply which supplies positive voltage to a positive bus 36 and negative voltage to a negative bus 38. The power supply may, for example, be the batteries 40 and 42.

There are employed in amplifier 10 a number of electric valves T indicated at T1, T2, T3, T4, T5, T6, T7, T8 and T9, each having a control electrode, a first type power electrode and a second type power electrode, and a power current path extending through the device from the first type power electrode to the second type power electrode. The term "first type power electrode" is adopted as a generic term covering collectors and anodes and other equivalent electrodes in transistors, electronic tubes and other electric valves. The term "second type power electrode" is adopted as a generic term covering emitters, cathodes and other equivalent electrodes in transistors, electronic tubes and other electric valves. Although other suitable amplifying devices may be employed, the valves T may be solid state valves, and are shown by way of preferred examples as transistors. Although other types of transistors may be employed, silicon transistors are desirable because they allow high operating temperatures, have very low leakage currents, and good uniformity between units. The respective control and first and second type power electrodes are related to transistors as follows. The base is a control electrode, the collector is the first type power electrode, the emitter is the second type power electrode, and the power path is the internal collector-emitter power path. The respective base, collector and emitter electrodes of each transistor are indicated by the reference characters B, C and E, respectively, each suffixed with the identifying number of the associated transistor. For example, the reference characters T2, E2, C2 and B2 are associated with the same valve. By way of example, transistors T1, T2, T3, T4, T5, T8, T9, T10 and T11 are shown as n-p-n type, while transistors T6 and T7 are shown as p-n-p type.

In the first differential amplifier stage 16, transistors T1 and T2 each are connected in common emitter configuration. The base B1 of transistor T1 is connected to input terminal 24, and to the positive bus 36 through a bias resistor 44. Collector C1 is connected to the base B3 and through a collector resistor 46 to the positive bus 36. Base B2 is connected to input terminal 28 and through a bias resistor 48 to the positive bus 36. A resistor 50 is connected between Base B2 and the power supply common 30. Collector C2 is connected to base B4 and through a collector resistor 52 to the positive bus 36.

Amplifier stage 16 has a constant-current generator type emitter circuit wherein emitters E1 and E2 are connected through a balancing potentiometer 54 to a conductor 56 connected to a constant current generating arrangement including transistor T5. Line 56 is connected to the collector C5 of transistor T5 whose emitter E5 is connected through a resistor 58 to the negative bus 38, and whose base B5 is connected through resistors 60 and 62 to the power supply common 30 and the negative bus 38 respectively. The circuit relations of transistor T5 and resistors 58, 60 and 62 form a constant current generator tending to maintain the current in line 56 at a constant value determined by the bias supplied to base B5 by the voltage dividing arrangement including resistors 60 and 62. Resistor 58 provides the necessary feedback, which, compared to the bias established by resistors 60 and 62 provides an error signal that drives transistor T5 to maintain its output current on line 56 constant.

Potentiometer 54 is adjusted to balance the emitter current flow through transistors T1 and T2 and provide zero output voltage from the amplifier output terminals 32–34 when there is zero voltage difference between the voltages on input terminals 24 and 28, each referenced to common input terminal 26. The applied voltages and the parameters of the circuit elements associated with each transistor T1 and T2 are chosen to so bias each of these transistors as to provide an operating point which will provide for each transistor symmetrical output variations in opposite directions (equal positive and negative output swings) around the quiescent output in response to equal positive and negative input drive signals applied to the transistor, thus to provide for each transistor a linear output across the operating range of negative and positive values of input signals (class A operation). Thus, each magnitude input signals of opposite polarities applied to each of these transistors drive the output of the transistor equal increments or symmetrically on opposite sides of the quiescent output value of the transistor. Note quiescent output is the output value at zero input drive signal. Any positive or negative difference between the voltages on terminals 24 and 28 will drive the outputs of transistors T1 and T2 correspondingly in opposite directions (push-pull). Thus, the respective outputs of transistors T1 and T2 will be driven in inverse relation, i.e., in opposite directions (push-pull), in response to any given input signal of either polarity applied to input terminal 24.

In response to the application of a signal voltage on terminal 24, transistors T1 and T2 are differentially driven by two concurrent intermediate effects. For example, when a positive signal is applied to terminal 24, transistor T1 is driven upward (more conductive). Because of the constant current constraint on line 56 imposed by transistor T5, the current increase through transistor T1 attempts to force a corresponding current decrease through transistor T2. In a concomitant action, the increased conduction through transistor T1 increases the current in line 56, thereby forcing, through the regulation of transistor T5, reduced conduction in transistor T5, thus increasing its effective impedance and thereby making collector C5 and emitter E2 more positive, thereby to drive transistor T2 downward (reduced conduction). The above actions provide a true differential effect. The production of the differential effect may also be explained by the fact that each of transistors T1 and T2 operates or acts as an emitter follower driving the emitter of the other transistor. As a result of this action increased conduction through transistor T1 causes the upper end of line 55 to go more positive thereby making E2 more positive to drive transistor T2 downward. Resistor (potentiometer) 54 is relatively small; impedance through line 56 is very large due to constant current action of T5; therefore a voltage change at E1 simultaneously occurs at E2.

In the second stage 18 of amplifier 12, collectors C3 and C4 are connected through collector resistors 64 and 66, respectively, to the positive bus 36. Collector C3 is also connected through output line 67 to base B6 of transistor T6 to provide a drive for the first stage 20 of amplifier 14. Collector C3 is also capacitively coupled to base B2 by means of a capacitor 68 to form part of a negative feedback circuit 69 which provides negative feedback to the first stage 16. Collector C4 is also capacitively coupled to base B1 by means of a capacitor 70 to provide symmetry to both sides of amplifier 12 and also to maintain approximately constant the input impedance at input terminal 24. As frequency goes up, less and less input signal current goes into base B1 while more an more of this signal current will be diverted through capacitor 70 to the common line 30.

The emitters E3 and E4 of transistors T3 and T4 are connected through a common line 72 and a resistor 74 to the negative bus 38. As a result of this connection, each of transistors T3 and T4 acts as an emitter follower driving the emitter of the other transistor. A resistor 76 and a capacitor 78 connected between collector C4 and line 69 form a stabilizing circuit for amplifier 12, to insure the high-frequency stability of this amplifier in the frequency range well beyond the frequency range used by the amplifier. This circuit does not become effective until frequencies in the 5 to 10 megacycle range are encountered and thus does not affect the amplifier until well past the frequency at which the gain becomes one (250 kc.). This circuit compensates for phase shifts which occur in the transistors and due to circuit stray capacitance, etc., which could cause instability when collectors C3 and C4 are connected back to bases B2 and B1, respectively.

Transistor T3 is biased to produce a predetermined "pivot" output value in response to the quiescent output of transistor T1, and to provide substantially equal positive and negative output swings of transistor T3 around its pivot output value in response to equal negative and positive output swings of transistor T1 around its quiescent output i.e., class A operation. Each of transistors T1 and T3 in the configuration shown is an inverting amplifier. As a result, the cascading of transistors T1 and T3 provides a double inversion. Thus, if the input signal applied to terminal 24 goes more positive, then the output of transistor T3 on line 67 goes more positive and vice versa. The biasing and relationship between transistors T2 and T4 is arranged to provide substantially the same results as the combination of transistors T1 and T3. That is, transistor T4 is biased to produce a predetermined pivot output value in response to the quiescent output of transistor T2, and to produce equal positive and negative output swings around its pivot output value in response to equal negative and positive output swings of transistor T2 around its quiescent output value.

It should be noted that while transistor T2 is differentially driven relative to and by transistor T1 through emitter drive, transistor T2 may additionally be driven by signals applied to input terminal 28. Either form of drive may be termed "external drive" to differentiate from permanent bias. The cascaded transistors T2 and T4 also perform a double inversion of any drive applied to transistor T2.

The parameters of capacitors 68 and 70 are chosen to provide negative feedback which attenuates the amplifier 12 output proportionately with increase in frequency until a predetermined frequency is reached at which point capacitors 67 and 70 are substantial short circuits to the AC (alternating current) components of the signals, thus tying the collectors C3 and C4 to bases B2 and B1, respectively. As a result, at and above the predetermined frequency collector C3 is at substantially the same AC potential and phase as base B2, and collector C4 is substantially at the same AC potential and phasing as base B1. Thus, at the aforesaid predetermined frequency, the gain of amplifier becomes unity with zero phase shift.

Capacitor 68 and resistor 50 are the main components of an RC circuit which determines the first and second breakpoints of the gain vs. frequency transfer characteristic of amplifier 12. The first breakpoint is downward and provides a lag component or time delay in which Laplace operator form may be represented as $$\frac{1}{1+t_1P}$$

wherein P is the Laplace operator ($j\omega$), and $t_1$ is the exponential time constant of the term defined as the time in seconds to reach 63% of its ultimate response to a step change (in this case an RC time constant).

$$\frac{1}{t_1}=\omega_1$$

the break frequency of the term. Thus, $$\frac{1}{1+t_1P}=\frac{1}{1+j\frac{\omega}{\omega_1}}$$

By way of example, the first breakpoint of amplifier 12 may be approximately at 14.5 c.p.s. (cycles per second) as illustrated in the Bode plot in FIG. 2 where the curve A is the transfer characteristic of amplifier 12.

A Bode plot is a diagram where gain is plotted vs. frequency for the elements of a system in order to analyze system stability characteristics. Although a Bode diagram may be plotted point by point by use of a test set-up, it is usually drawn from known transfer function control elements. It is generally drawn in approximate form, using asymptotes to the straight line portions of the actual characteristics. In FIG. 2, the solid lines are the true curves, while the dashed (for curve A) and dotted (for curve B) lines are the asymptotes. At downward breaks, the actual curves are 3 db below the intersection of the asymptotes. At the upward break, the actual curve A is 3 db above the intersection of the asymptotes. For most purposes, the approximate plot using asymptotes is sufficient.

The horizontal scale is calibrated for frequency and the vertical scale for gain or amplification. Gain and frequency are plotted in logarithmic scales. In the plot shown, a semi-log background is employed, gain being plotted in $$\text{db}-20\log_{10}\frac{e_{\text{out}}}{e_{\text{in}}}$$

db gain is a function of output versus sine wave input. The use of a logarithmic frequency scale allows the attenuation slope to be similar at various frequencies since equal distances along the horizontal scale will then be equal frequency ratios. The method used in making the plot of FIG. 2 gives a straight line characteristic for ease in constructing the plot. The first breakpoint of amplifier 12 associated with $t_1$ is indicated at $\omega_1$ on curve A in FIG. 2.

When transistor T1 is driven upward in response to the application of a positive input signal to terminal 24, collector C1 and base B3 are driven more negative thereby driving transistor T3 downward and making collector C3 more positive. In the meantime, the differential drive of stage 16 forces collector C2 and base B4 more positive, thereby driving transistor T4 upward and making collector C4 more negative. When collector C3 goes more positive, the feedback through capacitor 68 makes base B2 more positive, tending to drive transistor T2 upward. Because of the hereinbefore described differential drive action, emitter E1 is driven more positive, thereby tending to drive transistor T1 downward. Thus, the voltage on collector C3 applied through the feedback circuit 69 including capacitor 68, provides negative feedback to the first stage 16. In the meantime, circuit symmetry is effected by the feedback circuit 71 including capacitor 70. The action of feedback through 68 and to E1 reduces the current into B1 for a given voltage drive at B1. Therefore, the impedance into B1 increases with frequency. Feedback through 70 to B1 however tends to draw more current away from B1 as frequency increases thus tending to equalize the impedance into B1.

In response to a negative input signal being applied to input terminal 24 and base B1, corresponding opposite reactions take place in amplifier section 12. The output of amplifier section 12 is taken from across collector resistor 64 of transistor T3, and applied through the positive bus 36 and output line 67 across the base-emitter junction of transistor T6 in stage 20.

The decreased impedance of capacitors 68 and 70 to substantially short circuit to alternating current at high frequencies results in an upward breakpoint and the lead term $1+t_2P$ for the transfer characteristic of amplifier 12, $t_2$ is the RC time constant of the lead term, and P the Laplace operator. $1/t_2=\omega_2$=break frequency of lead term. The breakpoint associated with the lead term $1+t_2P$ may for example be approximately 7,300 c.p.s. as indicated at $\omega_2$ on curve A in FIG. 2.

As a result of the above-described lag and lead terms, the composite transfer characteristic for amplifier section 12 is $$\frac{e_{out}}{e_{in}}=A_1\frac{1+t_2P}{1+t_1P}$$

where $e_{out}$ and $e_{in}$ are the output and input voltages respectively, and $A_1$ is the DC voltage gain of amplifier 12, and $t_1=(1+A_1)t_2$.

In the following examples $R_2$ is resistor 50, $C_1$ is capacitor 68, $t_2=R_2C_1$, $e_1$ is voltage on terminal 24, $e_2$ is voltage on terminal 28, $e_{01}$ is output on line 67, and $t_1=(1+A_1)R_2C_1$ $$e_{01}=A_1(e_1-e_2)$$

$$e_2=e_{01}\frac{R_2}{R_2+\frac{1}{C_1P}}$$

therefore $$e_{01}=A_1e_1-A_1\left(\frac{e_{01}R_2}{R_2+\frac{1}{C_1P}}\right)$$

$$\frac{e_{01}}{e_1}=A_1\left(\frac{1+R_2C_1P}{1+(1+A_1)R_2C_1P}\right)$$

let $$t_2=R_2C_1$$

$$t_1=(1+A_1)R_2C_1$$

then $$t_1=(1+A_1)t_2$$

Since the horizontal straight line portion AX associated with the lead term $1+t_2P$ is at substantially unity gain, it lies in line with the zero db index mark on the gain scale $G_1$ for amplifier 12, whose gain may, for example be approximately 55 db as indicated in FIG. 2.

In amplifier stage 20, emitter E6 is connected through a resistor 80 to the positive bus 36, and through a resistor 81 to the common 30. Transistor T6 is shown by way of example as a p-n-p transistor. Collector C6 is connected to the negative bus 38 through a collector resistor 82 in parallel with a circuit including a capacitor 84 and a resistor 86. Collector C6 is also connected through an output line of stage 20 to base B7 to provide a drive for amplifier stage 22.

Transistor T6 is biased for class A operation to provide a predetermined pivot output value in response to the pivot output value of transistor T3, and to provide equal opposite polarity swings around output pivot value of transistor T6 in response to equal positive and negative output swings of transistor T3 around its pivotal output value.

It will be noted that the heretofore described connections provide to stage 20 a bridge configuration having junctions M, N, O and P with bridge arms between these junctions as follows: Battery 40 is in the bridge arm between junctions M and N; battery 42 is in a bridge arm between junctions N and O; resistor 82 is in a bridge arm between junctions O and P; and the collector-emitter current path of transistor T6 is in the bridge arm between junctions P and M. The variable impedance of transistor T6 controls the output voltage of the bridge which is across junctions P and N. Thus the voltage across junctions P and N is controlled in response to the input signals supplied to the input of transistor T6 at base B6. The bridge output at junctions P–N is the output of the amplifier stage 20 and is fed to the input circuit of transistor T7 by connecting junction P to base B7 and junction N to emitter E7 through a resistor 88 and a circuit junction 90. The collector C7 is connected through a collector or output resistor 92 to the negative bus 38 and through a resistor 94 to base B8.

The components of stage 20 are so related that when the output of transistor T6 is at its pivotal or reference value (input signal at 24 and 26 is zero), junction P is substantially zero or in a practical example very slightly negtaive. While the voltage at P is for this condition desirably at zero potential, as a practical matter it will have a slight negative potential as a result of the base emitter junction voltage drop of transistor T7. The arrangement in stage 20 is such that as the input signal on base B6 goes more positive the bridge junction P goes more negative and vice versa.

The first stage 20 of amplifier 14 provides added voltage gain to the amplifier 10. The gain of stage 20 depends on and is nearly equal to the ratio of resistance at collector C6 to net resistance at emitter E6. Thus the gain of stage 20 depends on and very nearly equals the ratio of collector resistor 82 to the emitter resistor 80 in parallel with resistor 81. Resistors 80 and 81 form a voltage divider which establishes the voltage at the point R and contributes to the correct biasing of transistor T6. Resistor 81 is a bleeding resistor to reduce the voltage at emitter E6, thus allowing the impedance in the emitter circuit to be a smaller value, thereby to help increase the ratio between resistor 82 and the emitter circuit resistance in order to increase the gain of the stage 20.

Stage 20 is provided with a lag network to impart to the stage and consequently the section 14 a lag term transfer characteristic $$\frac{1}{1+t_3P}$$

having a breakpoint (break frequency) $\omega_3$ occurring for example at approximately 7,300 c.p.s. as indicated at $\omega_3$ in FIG. 2. The major and dominating components of the lag network are the resistor 82 and the capacitor 84. Resistor 86 may have a relatively low value, for example, around 250 ohms. If the value of resistor 86 is kept low, it becomes a minor factor in the lag network. Resistor 82 is relatively high, for example, around 21,000 ohms. Capacitor 84 is in a shunt path across resistor 82. As the signal frequency increases, the impedance of capacitor 84 decreases thus attenuating the output of stage 20 as frequency increases. The transfer characteristic of amplifier section 14 is the curve B in FIG. 2.

Resistor 86 in conjunction with capacitor 84 provides a high frequency lead term that cancels high frequency lags that begin to occur well beyond the 250 kc. band-pass to insure a phase shift not exceeding 90° through the 250 kc. range.

Transistor T7 is biased above cut-off to provide class A operation around a pivot or reference output value so that its output swings in respective opposite directions around the pivot value (that is, above and below the pivot value) in response to swings between opposite polarities of input voltage at the amplifier 10 input. The output of stage 22 is applied to the input of stage 23 by coupling collector C7 to base B8 through a resistor 94.

Stage 23, in addition to transistor T8 also includes transistor T9 which is controlled by transistor T8 so that transistors T8 and T9 operate in push-pull and very nearly class B operation to provide high efficiency. Collector C8 is coupled through a diode 100 to the amplifier output line 34 and to base B9 through a diode 102. Emitter E8 is connected through an emitter resistor 104 to the negative bus 38. Collector C9 is connected to the positive bus 36 and a resistor 106 is connected from base B9 to the positive bus 106. Emitter E9 is connected through an emitter resistor 108 to the amplifier output line 34. The output terminal 34 is also connected to point 90 through a resistor 110. Resistors 110 and 88 form a load resistor across the amplifier output terminals 34 and 32 with a voltage dividing tap 90 connected to the emitter E7.

Transistor T8 is biased for class A operation, but near cut-off. Transistor T10 is biased to cut-off at the amplifier 10 quiescent. In response to a negative signal at junction P above the pivotal value, collector C7 and base B8 go more positive to render transistor T8 more conductive (drive transistor T8 upward) causing an increase of an output current component flowing in a path which may be traced from the power supply common 30 through terminal 32, the load connected between terminals 32 and 34, diode 100, the collector-emitter path of transistor T8, resistor 104, to the negative bus 38. In the meantime the current flow through diode 100 renders its cathode negative which negative potential is coupled through diode 102 to the base B9 of transistor T9 thereby to cut off transistor T9. For the condition just described the current flows through the load circuit from terminal 32 to terminal 34 in a direction from terminal 32 to terminal 34 as a result of positive drive to base B1.

On the other hand when junction P increases positively relative to its pivot value in response to a negative drive to base B1, transistor T8 is driven downward below its pivot value and the cathode of diode 100 becomes more positive, which positive potential is applied through diode 102 to base B9 thereby to drive transistor T9 into conduction above cut off to supply current to the amplifier load through a path which may be traced from the positive bus 36 through the power path of transistor T9, resistor 108, the load connected to terminals 34 and 32, to the common 30 of the power supply. The arrangement of stage 23 is such that under the circumstances the current through transistor T8 is so small that it is practically at cut off. Thus, the amplifier operates at substantially class B operation. It will be noted that the last current path traced indicates that the current in the amplifier output passes in a direction from terminal 34 to terminal 32 in response to a negative input drive to base B1.

At zero output or quiescent, current flows from the power bus 36 through resistor 106, diode 102, transistor T8 and resistor 104 to the negative bus 38. Diode 102 is always conductive. When conduction through transistor T8 is reduced as a result of appropriate input signals, conduction to diode 102 current is diverted to the base of transistor T9 to drive the transistor up.

Resistors 88 and 110 form a voltage divider with a tap 90 connected to the emitter E7 that provides negative feedback to transistor T7 in order to provide constant gain, that is a flat response, through the normal operating range of frequencies, to the stages 22 and 23 operating as a unit. The negative feedback arrangement tends to maintain the voltage between the emitter and base of transistor T7 constant. The gain of stages 22 and 23 operating as a unit is determined by the ratio of the sum of resistors 88 and 110 to the resistor 88. Thus the gain is controlled by passive elements independent of the active elements such as the transistors in the circuit.

In order to protect transistors T8 and T9 and associated circuit elements from damage due to high currents as a result of accidental short circuiting of the amplifier circuit output terminals 34 and 32 by a load, each of these transistors has associated therewith an individual current limit circuit for limiting the upper value of the respective collector-emitter currents of these transistors to a safe upper limit. For this purpose transistors T10 and T11 are associated with transistors T8 and T9 respectively.

Transistor T8 drives transistor T10 through an emitter follower connection from emitter E8 to base B10. The output of transistor T10 is coupled to the input of transistor T8 in negative feedback relation by a connection 111 from collector C10 to base B8. Line 111 is also connected through resistor 94 and the power path of transistor T7 and resistor 88 to the power supply common 30. Emitter E10 is connected to the negative bus 38 through a diode 112. Transistor T10 is normally biased below cut off by the forward voltage drop across diode 112 produced by the current in a circuit including diode 112 and a resistor 114 connected between the power supply common 30 and the junction between emitter E10 and diode 112. Resistor 104 provides to base B10 a voltage pick-off responsive to the collector emitter current of transistor T8. The diode 112 provides to transistor T10 a current limit reference bias such that when the collector-emitter current of transistor T8 exceeds a safe predetermined limit the reference bias supplied by diode 112 is overcome and transistor T10 is driven into conduction to provide a negative feedback drive to transistor T8, thereby to prevent the collector-emitter current of T8 from exceeding the safe limit.

The current limit circuit for transistor T9 and employing transistor T11 is similar in configuration and operates in substantially the same way as the current limit circuit associated with transistor T8. Collector E9 is connected to base B11 to provide a drive to transistor T11 responsive to the collector-emitter current of transistor T9. Collector C11 is connected to the positive bus 36 through resistor 106 and to base B9 in negative feedback relation. A reference bias is applied to emitter E11 by a voltage dividing circuit including a diode 116 and a resistor 118, the forward drop across diode 116 supplying the reference voltage to emitter E11. When the collector-emitter current through transistor T9 exceeds the safe predetermined limit, the drive to base B11 is sufficient to overcome the reference bias supplied by diode 116, thus driving transistor T11 into conduction to apply negative feedback to base B9 thereby to limit the collector-emitter current of T9 to the safe predetermined value.

The parameters of the circuit elements associated with transistors in stages 16, 18, 20 and 22 are chosen to provide the respective transistors with operating points such that each transistor furnishes an output which may be referred to as "pivot output value" in response to zero input signal on terminal 24, and substantially symmetrical output changes in opposite directions from the pivot value (above and below the pivot value) in response to opposite polarity input signals applied to input terminal 24. Thus at zero input drive to transistor T1 or when the difference between the voltages at input terminals 24 and 28 is zero, transistor T7 provides a predetermined pivotal output value, and the output of transistor T7 may be driven higher or lower than its pivot value depending on the polarity of input drive signals applied to input terminal 24 or the difference polarity of drive signals applied to terminals 24 and 28.

The circuit parameters of stage 22 are chosen so that when the aforesaid predetermined pivot output value of transistor T7 (corresponding to zero input at input 24) is applied to base B8, the output of stage 23 and of the entire amplifier 10 at output terminals 32 and 34 is zero. Potentiometer 54 may be used as a trimmer to adjust for this condition of zero output. The types of transistors and cascading relations are chosen to result in an output at 32 and 34 for amplifier 10 which is an inverse function of its input at terminal 24, that is, an inverting amplifier. Thus, when a positive signal is applied to terminal 24, the output is negative at terminal 34; and when a negative signal is applied to terminal 24, the output at terminal 34 is positive. Thus, the amplifier 10 is an inverting bidirectional amplifier.

A series resistance (120) and capacitance (122) network connected across the collector-base junction of transistor T9 stabilizes transistors T7, T8 and T9 in case of slight phase shift in the normal operating range of frequencies. Stages 22 and 23 do not alter the transfer characteristic of stage 20. Thus, the transfer characteristic of amplifier section 14 is $$\frac{e_{\text{out}}}{e_{\text{in}}}=-A_2\frac{1}{1+t_3P}$$

where $-A_2$ is the D-C gain of amplifier 14, $t_3$ is the RC time constant of the lag term, and P is the Laplace operator. By way of example the gain of amplifier section 14 is shown as about 30 db as indicated in FIG. 2 on gain scale G2.

In accordance with a preferred embodiment of the present invention, the circuit parameters are chosen to make $t_3$ substantially equal to $t_2$. Thus, the upward breakpoint of the transfer characteristic of amplifier 12 is at substantially the same frequency as the downward breakpoint of the transfer characteristic of amplifier 14. In other words, the break frequency of the lead term of the amplifier section 12 transfer characteristic is substantially the same as the break frequency of the lag term characteristic of amplifier section 14.

The closer that $t_3$ and $t_2$ are made to being equal, the higher the quality of the amplifier, that is, the more nearly the amplifier transfer characteristic corresponds to a single time delay. However, although it is preferred that $t_2$ and $t_3$ be substantially equal, either of $t_2$ and $t_3$ may differ from the other by as much as ±25% and still provide an acceptable amplifier for less stringent applications, for example where a slower response can be tolerated. Thus, while $t_2$ and $t_3$ should be substantially equal for the highest quality amplifier with a transfer characteristic corresponding to a single time delay, the invention may also be practiced by selecting the values to $t_2$ and $t_3$ such that $t_2$ is from 75% to 125% of $t_3$, and $t_3$ is from 75% to 125% of $t_2$, i.e., each of $t_2$ and $t_3$ has the value of the other within a tolerance of ±25%.

The composite transfer characteristic of amplifier 10 is $$\frac{e_{\text{out}}}{e_{\text{in}}}=A_1\left(\frac{1+t_2P}{1+t_1P}\right)\left(-A_2\frac{1}{1+t_3P}\right)$$

If $t_2$ is made equal to $t_3$, the transfer characteristic becomes $$\frac{e_{\text{out}}}{e_{\text{in}}}=-A_1A_2\frac{1}{1+t_1P}$$

By placing the lowest frequency break ($\omega_1$) in the first amplifier in position (amplifier 12), and the highest frequency break ($\omega_3$) in the second amplifier in position (amplifier 14), full output amplitude and power is obtained from the composite amplifier over a frequency range exceeding the $\omega_3$ frequency.

It will be noted that in order to make an inverting amplifier 10 either section 12 or section 14 must be an inverting section. In the example disclosed section 14 is the inverting section. However, from the teachings disclosed herein it will be apparent to those skilled in the art that section 12 may be made the inverting section while section 14 is made non-inverting.

The composite transfer characteristic of amplifier 10 is illustrated by adding following sections of the curves in FIG. 2: horizontal section AY of curve A, sloping section AZ of curve A, and sloping section BZ of curve B. Thus, the transfer characteristic of amplifier 10 corresponds to a single time delay, most desirable in a DC amplifier for use as an operational amplifier. As shown, a time delay element is drawn as a horizontal line with no attenuation up to its natural frequency or break-point. Beyond this, it is drawn at a slope of −20 db per decade. Since $$\omega_1=\frac{1}{(1+A_1)t_2}$$

if gain A changes due to changes in component parameters (especially transistors T1, T2, T3 and T4), only $\omega_1$ is affected, while $\omega_2$ and $\omega_3$ are unaffected. $\omega_2$ and $\omega_3$ are functions of passive components only. If $\omega_1$ changes due to change of $A_1$, only the initial portion of curve A changes as indicated by the —o— curve projection, the $\omega_1$ point for this curve being indicated at F. This does not affect $\omega$ at zero db or the stability of the amplifier.

In a successful operating example of the invention, the various circuit components of FIGURE 1 have the following values and type designations:

| | | |
|---|---|---|
| Transistors T1, T2, T3, T4, T5 (type) | | 2N2195 |
| Transistors T6 and T7 (type) | | 2N1132 |
| Transistors T8, T9, T10 and T11 (type) | | 2N1613 |
| Resistors 44, 48 (each) | megohms | 10 |
| Resistors 50, 81, 92 and 118 (each) | kilohms | 10 |
| Resistors 46, 52 (each) | do | 178 |
| Resistor 58 | do | 68.1 |
| Resistors 60, 62, 82 and 104 (each) | do | 21.5 |
| Resistors 64, 66 (each) | do | 56.2 |
| Resistor 74 | do | 121 |
| Resistor 76 | ohms | 316 |
| Resistors 80 and 110 (each) | kilohms | 2.15 |
| Resistor 86 | ohms | 261 |
| Resistors 88, 94 and 114 (each) | do | 1000 |
| Resistor 108 | do | 10 |
| Resistor 120 | do | 464 |
| Potentiometer 54 | do | 500 |
| Capacitors 68–70–122 (each) | mfd | .0022 |
| Capacitors 78 and 84 (each) | mfd | .001 |
| Diodes 100 and 116 forward drop (each) | volts | 0.3 |
| Diode 102 forward drop | do | 0.7 |
| Diode 112 forward drop | do | 1.4 |
| Batteries 40 and 42 (each) | do | 24 |

The breakpoints $\omega_1$, $\omega_2$, and $\omega_3$, for the example using the above component values, may be approximately computed as follows:

$A_1$ is approximately 55 $db \cong 500$ volts/volt,
$t_1=(1+A_1)$ (resistor 50×capacitor 68)= $501\times10{,}000\times0.0022\times10^{-6}=0.011$ seconds,
$t_2$=resistor 50×capacitor 68= $10{,}000\times0.0022\times10^{-6}=0.000022$ seconds,
$t_3$=resistor 82×capacitor 84= $21{,}500\times0.001\times10^{-6}=0.0000215$ seconds,
$\omega_1=1/t_1=90.9$ radians/second=14.5 c.p.s. (cycles/second),
$\omega_2=1/t_2=45400$ rad./sec.=7250 c.p.s.,
$\omega_3=1/t_3=46500$ rad./sec.=7400 c.p.s.,
Thus, $t_2 \cong t_3$ and $\omega_2 \cong \omega_3$ The various diodes shown herein may be any suitable asymmetric devices, for example semiconductor diodes.

In the aforementioned copending patent application Ser. No. 370,840 (now Patent No. 3,327,235), the examples of use disclosed for the amplifier 10 in operational amplifiers are equally applicable to the amplifier 10 herein are considered a part of the present disclosure.

In normal operation as an operational amplifier the input signals are applied through an input impedance to input terminal 24, with input terminal 28 connected to common through resistor 50. However, if desired, separate signals may be applied to terminals 24 and 28 to obtain an output at 34 and 32 which is a function of their difference. Or the operational amplifier can be used non-inverting by connecting terminal 24 to common through an impedance and applying the input signal to an impedance network connected to terminal 28.

From the foregoing description, it will be appreciated that the present invention provides an economical yet accurate DC amplifier with a high efficiency output stage admirably suited for use in operational amplifiers and also having an output current limit protection circuit.

While the invention has been particularly shown and described with reference to a preferred embodiment thereof, it will be understood by those skilled in the art that various changes in form and details may be made therein without departing from the spirit and scope of the invention.

What is claimed is:

1. In an electric signal amplifier having respective input and output circuits, first, second and third electric valves each having respective control and first and second power electrodes, and an internal power path extending from one to the other of its power electrodes, each valve having respective input and output circuits, respective first, second, third and fourth junctions, a first circuit leg connected between said first and second junctions and including first D.C. power supply means poled to provide a particular polarity at said first junction relative to the second junction, a second circuit leg connected between said second and third junctions and including second power supply means poled to provide the opposite polarity to said third junction relative to the second junction, a third circuit leg connected between said third and fourth junctions and including impedance means, a fourth circuit leg connected between said first and fourth junctions and including the power path output of the first valve, whereby said four circuit legs constitute the legs of a bridge wherein the output across said second and fourth junctions is controlled in response to input signals applied to the control electrode of the first valve, means including a circuit connecting said fourth junction to the control electrode of the second valve for controlling the second valve in response to said output across said second and fourth junctions, means including a circuit connecting one of said power electrodes of the second valve to the control electrode of the third valve for driving the third valve in response to the second valve, said amplifier having an output circuit driven by said third valve and including said second junction and an output terminal connected to one of said power electrodes of the third valve, a negative feedback circuit for supplying negative feedback from the amplifier output to the second valve, said negative feedback circuit including a tapped voltage divider connected across said output terminal and said second junction and a connection from one of said power electrodes of the second valve to a tap on said voltage divider.

2. The combination as in claim 1 wherein each of said valves is a solid state valve.

3. The combination as in claim 1 and further including means for limiting the current through said power path of the third valve to a predetermined upper limit value, said current limit means comprising a fourth electric valve having respective control and first and second power electrodes and an internal power path extending from one to the other of said power electrodes, means for providing a substantially fixed reference bias to said fourth valve, means including a connection from a power electrode of the third valve to said control electrode of the fourth valve for supplying to the fourth valve a control signal proportional to the power path current of the third valve, and a negative feedback connection from a power electrode of the fourth valve to said control electrode of the third valve, whereby when said control signal to the fourth valve overcomes said reference bias, the fourth valve is driven to in turn drive the third valve downward to limit its power path current to said predetermined upper limit.

4. The combination as in claim 3 wherein each of said valves is a solid state valve .

5. In an electric signal amplifier having respective input and output circuits, first, second, third and fourth electric valves each having a control electrode, a first type power electrode, a second type power electrode, and an internal power path extending from one to the other of its power electrodes, each valve having respective input and output circuits, respective first, second, third and fourth junctions, a first circuit leg connected between said first and second junctions and including first D.C. power supply means poled to provide a particular polarity at said first junction relative to the second junction, a second circuit leg connected between said second and third junctions and including second power supply means poled to provide the opposite polarity to said third junction relative to the second junction, a third circuit leg connected between said third and fourth junctions and including impedance means, a fourth circuit leg connected between said first and fourth junctions and including the power path of the first valve, whereby said four circuit legs constitute the legs of a bridge wherein the output across said second and fourth junctions is controlled in response to input signals applied to the control electrode of the first valve, means including a circuit connecting said fourth junction to the control electrode of the second valve for controlling the second valve in response to said bridge output across said second and fourth junctions, means including a circuit connecting one of said power electrodes of the second valve to the control electrode of the third valve for driving the third valve in response to the second valve in such a manner that the third valve is driven above or below a predetermined value depending on whether the input signal to the first valve is a particular one or the other respectively of above and below a reference value, means including a circuit connecting said first type electrode of the third valve to said control electrode of the fourth valve, for controlling the fourth valve in response to the third valve, said fourth valve being driven upward above cut-off in response to the third valve being driven downward below said predetermined value, said fourth valve being held at cut-off in response to the third valve being driven above said predetermined value, said amplifier having an output circuit driven by a particular one or the other of said third and fourth valves depending on whether the input signal to the first valve is respectively above or below said reference value, said amplifier output circuit including said second junction and an output terminal connected to said first type power electrode of the third valve and to said second type power electrode of the fourth valve, and a negative feedback circuit for supplying negative feedback from the amplifier output to the second valve, said negative feedback circuit including a tapped voltage divider connected across said ouput terminal and said second junction and a connection from one of said power electrodes of the second valve to a tap on said voltage divider.

6. The combination as in claim 5 wherein each of said valves is a solid state valve.

7. The combination of claim 5 and further including means for limiting the respective power path currents of said third and fourth valves to a predetermined upper value, said current limiting means comprising fifth and sixth electric valves each having a control electrode and respective first and second power electrodes and an internal power current path extending from one to the other of its said power electrodes, circuit means including a connection from said second type electrode of the third valve to said control electrode of the fifth valve for causing the third valve to operate as a second type power electrode follower to drive the fifth valve, circuit means including a connection from said second type power electrode of the fourth valve to said control electrode of the sixth valve for causing the fourth valve to operate as a second type power electrode follower to drive the sixth valve, means coupling one of said power electrodes of the fifth valve to said control electrode of the third valve in negative feedback relation, means coupling one of said power electrodes of the sixth valve to said control electrode of the fourth valve in negative feedback relation, and means for biasing said fifth and sixth valves so that they can be driven to cause a reduction of the power path currents of the third and fourth valves to said predetermined upper limit only in response to said currents exceeding said upper limit.

8. The combination of claim 7 wherein each of said valves is a solid state valve.

9. In an electric signal amplifier having an input circuit and an output circuit: first, second, third and fourth electric valves, each having respective control and first and second power electrodes, and an internal power path extending from one to the other of its said power electrodes; a first branch connected across said output circuit, said first branch including said power path of the first valve and first power supply means; a second branch connected across said output circuit, said second branch including said power path of the second valve and second power supply means; said respective power supply means being so poled that said branches are connected in opposite polarity across said output circuit; said input circuit being coupled to the control electrode of the first valve whereby said first valve is driven by signals applied to said input circuit; means coupling one of said power electrodes of the first valve to said control electrode of the second valve, whereby the second valve is driven in an inverse manner relative to the drive of the first valve; and means for limiting the respective power path currents of the first and second valves to a predetermined upper value, said current limiting means comprising circuit means including a connection from one of said electrodes of the first valve to said control electrode of the third valve for causing the first valve to drive the third valve, circuit means including a connection from one of said power electrodes of the second valve to said control electrode of the fourth valve for causing the second valve to drive the fourth valve, means coupling one of said power electrodes of the third valve to said control electrode of the first valve in negative feedback relation, means coupling one of said power electrodes of the fourth valve to said control electrode of the second valve in negative feedback relation, and means for applying bias to said third and fourth valves to render the third and fourth valves ineffective to negatively drive said first and second valves until said currents exceed said upper limit.

10. The combination as in claim 9 wherein each of said valves is a solid state valve.

11. In an electric signal amplifier, first, second, third and fourth electric valves, each having a control electrode, a first type power electrode, a second type power electrode, and an internal power path extending from one to the other of its said power electrodes, means including a circuit connected to the control electrode of the first valve for driving the first valve output above or below a predetermined value depending on whether the input signal to the first valve is a particular one or the other respectively of above and below a reference value, means including a circuit connecting said first type electrode of the first valve to said control electrode of the second valve for controlling the second valve in response to the first valve, said second valve being driven upward above cut-off in response to the first valve being driven downward below said predetermined value, said second valve being held cut-off in response to the first valve being driven above said predetermined value, said amplifier having an output circuit driven by a particular one or the other of said first and second valves depending on whether the input signal to the first valve is respectively above or below said reference value, and means for limiting the respective power path currents of said first and second valves to a predetermined upper value, said current limiting means comprising circuit means including a connection from said second type power electrode of the first valve to said control electrode of the third valve for causing the first valve to operate as a second type power electrode follower to drive the third valve, circuit means including a connection from said second type power electrode of the second valve to said control electrode of the fourth valve for causing the second valve to operate as a second type power electrode follower to drive the fourth valve, means coupling one of said power electrodes of the third valve to said control electrode of the first valve in negative feedback relation, means coupling one of said power electrodes of the fourth valve to said control electrode of the second valve in negative feedback relation, and means for biasing said third and fourth valves so that they can be driven to cause a reduction of the power path currents of the first and third valves to said predetermined upper limit only in response to said currents exceeding said upper limit.

12. The combination as in claim 11 wherein each of said valves is a solid state valve.

13. An amplifier having respective input and output circuits and further comprising first, second, third and fourth transistor means each having respective base, collector and emitter electrodes, each transistor means having respective input and output circuits, respective first, second, third and fourth junctions, a first circuit leg connected between said first and second junctions and including first D.C. power supply means poled to provide a particular polarity at said first junction relative to the second junction, a second circuit leg connected between said second and third junctions and including second D.C. power supply means poled to provide the opposite polarity to said third junction relative to the second junction, a third circuit leg connected between said third and fourth junctions and including first impedance means, a fourth circuit leg connected between said first and fourth junctions and including the collector-emitter path of the first transistor means, whereby said four circuit legs constitute the legs of a bridge wherein the output across said second and fourth junctions is controlled in response to input signals applied to the base electrode of the first transistor means, means including a circuit connecting said fourth junction to the base electrode of the second transistor means for controlling the second transistor means in response to said output across said second and fourth junctions, means including a circuit connecting the collector electrode of the second transistor means to the base electrode of the third transistor means for driving the third transistor means in response to the second transistor means, said amplifier output circuit including said second junction and an output terminal, voltage dividing means connected across said second junction and said output terminal, said voltage dividing means having a tap connected to the emitter electrode of the second transistor means, a first asymmetric device through which the collector electrode of the third transistor means is connected to said output terminal, second impedance means through which the emitter of the third transistor means is connected to said third junction, means connecting the collector electrode of the fourth transistor means to said first junction, third impedance means through which the emitter of the fourth transistor is connected to said output terminal, a second asymmetric device through which the collector electrode of the third transistor is connected to the base electrode of the fourth transistor, fourth impedance means through which the base electrode of the fourth transistor is connected to said first junction, said first and second asymmetric devices being poled in the direction of load current flow through the third transistor means.

14. The combination of claim 13 and further including means for limiting the respective collector-emitter currents of said third and fourth transistor means to a predetermined upper value, said current limiting means comprising fifth and sixth transistor means each having respective base, collector and emitter electrodes, means connecting the emitter electrode of the third transistor means to the base electrode of the fifth transistor means for causing the third transistor means to drive the fifth transistor means, means connecting the emitter electrode of the fourth transistor means to the base electrode of the sixth transistor means for causing the fourth transistor means to drive the sixth transistor means, means coupling the collector electrode of the fifth transistor means to the base electrode of the third transistor means in negative feedback relation, means coupling the collector electrode of the sixth transistor means to the base electrode of the fourth transistor means in negative feedback relation, a first bias circuit for applying a negative bias to the fifth transistor means, said first bias circuit including fifth impedance means connected between said second junction and the emitter electrode of the fifth transistor means, and a third asymmetric device connected between said third junction and the emitter electrode of the fifth transistor means, and a second bias circuit for applying a negative bias to the sixth transistor means, said second bias circuit including sixth impedance means connected between said first junction and the emitter of the sixth transistor means, and a fourth asymmetric device connected between said output terminal and the emitter electrode of the sixth transistor means.

15. Amplifying apparatus comprising first and second cascaded amplifier sections, each having respective input and output circuits, the output circuit of the first section being coupled to the input circuit of the second section, whereby the second section is driven by the first section, said first section having the transfer characteristic $$\frac{\text{output}}{\text{input}}=A_1\frac{1+t_2P}{1+t_1P}$$

said second section having the transfer characteristic $$\frac{\text{output}}{\text{input}}=A_2\frac{1}{1+t_3P}$$

where $t_1$, $t_2$ and $t_3$ are time constants, $t_1>t_2$, $t_1>t_3$, $A_1$ is the gain of the first amplifier section, $A_2$ is the gain of the second amplifier section, and P is the Laplace operator, said second amplifier section comprising first, second and third electric valves each having respective control and first and second power electrodes, and an internal power path extending from one to the other of its power electrodes, each valve having respective input and output circuits, respective first, second, third and fourth junctions, a first circuit leg connected between said first and second junctions and including first D.C. power supply means poled to provide a particular polarity at said first junction relative to the second junction, a second circuit leg connected between said second and third junctions and including second power supply means poled to provide the opposite polarity to said third junction relative to the second junction, third circuit leg connected between said third and fourth junctions and including impedance means, a fourth circuit leg connected between said first and fourth junctions and including the power path output of the first valve, whereby said four circuit legs constitute the legs of a bridge wherein the output across said second and fourth junctions is controlled in response to input signals applied to the control electrode of the first valve, means including a circuit connecting said fourth junction to the control electrode of the second valve for controlling the second valve in response to said output across said second and fourth junctions, means including a circuit connecting one of said power electrodes of the second valve to the control electrode of the third valve for driving the third valve in response to the second valve, said second section amplifier having an output circuit driven by said third valve and including said second junction and an output terminal connected to one of said power electrodes of the third valve, a negative feedback circuit for supplying negative feedback from the amplifier output to the second valve, said negative feedback circuit including a tapped voltage divider connected across said output terminal and said second junction and a connection from one of said power electrodes of the second valve to a tap on said voltage divider.

16. The combination as in claim 15 and further including means for limiting the current through said power path of the third valve to a predetermined upper limit value, said current limit means comprising a fourth electric valve having respective control and first and second power electrodes and an internal power path extending from one to the other of said power electrodes, means for providing a substantially fixed reference bias to said fourth valve, means including a connection from a power electrode of the third valve to said control electrode of the fourth valve for supplying to the fourth valve a control signal proportional to the power path current of the third valve, and a negative feedback connection from a power electrode of the fourth valve to said control electrode of the third valve, whereby when said control signal to the fourth valve overcomes said reference bias, the fourth valve is driven to in turn drive the third valve downward to limit its power path current to said predetermined upper limit.

17. Amplifying apparatus comprising respective preceding and following amplifier sections each having respective input and output circuits, the output circuit of the preceding section being coupled to the input circuit of the following section, said preceding amplifier section having a negative feedback circuit coupled between its output and input circuits, said feedback circuit providing a response which decreases as the frequency increases up to a predetermined frequency at which point the feedback circuit becomes a substantial short circuit to frequencies above said predetermined frequency, whereby the input and output circuits of the first amplifier section are at the same AC potential at frequences above said predetermined frequency, said following amplifier section having a gain characteristic which is substantially constant for frequencies below said predetermined frequency and which gain decreases as the frequency increases for frequencies above said predetermined frequency, whereby said amplifying sections in composite form exhibit the characteristic of a single time delay, said following amplifier section comprising first, second, third and fourth electric valves each having a control electrode, a first type power electrode, a second type power electrode, and an internal power path extending from one to the other of its power electrodes, each valve having respective input and output circuits, respective first, second, third and fourth junctions, a first circuit leg connected between said first and second junctions and including first D.C. power supply means poled to provide a particular polarity at said first junction relative to the second junction, a second circuit leg connected between said second and third junctions and including second power supply means poled to provide the opposite polarity to said third junction relative to the second junction, a third circuit leg connected between said third and fourth junctions and including impedance means, a fourth circuit leg connected between said first and fourth junctions and including the power path of the first valve, whereby said four circuit legs constitute the legs of a bridge wherein the output across said second and fourth junctions is controlled in response to input signals applied to the control electrode of the first valve, means including a circuit connecting said fourth junction to the control electrode of the second valve for controlling the second valve in response to said bridge output across said second and fourth junctions, a circuit connecting one of said power electrodes of the second valve to the control electrode of the third valve for driving the third valve in response to the second valve, means including a circuit connecting one of said power electrodes of the second valve to the control electrode of the third valve for driving the third valve in response to the second valve in such a manner that the third valve is driven above or below a predetermined value depending on whether the input signal to the first valve is a particular one or the other respectively of above and below a reference value, means including a circuit connecting said first type electrode of the third valve to said control electrode of the fourth valve, for controlling the fourth valve in response to the third valve, said fourth valve being driven upward above cut-off in response to the third valve being driven downward below said predetermined value, said fourth valve being held at cut-off in response to the third valve being driven above said predetermined value, said amplifier having an output circuit driven by a particular one or the other of said third and fourth valves depending on whether the input signal to the first valve is respectively above or below said reference value, said amplifier output circuit including said second junction and an output terminal connected to said first type power electrode of the third valve and to said second type power electrode of the fourth valve, and a negative feedback circuit for supplying negative feedback from the amplifier output to the second valve, said negative feedback circuit including a tapped voltage divider connected across said output terminal and said second junction and a connection from one of said power electrodes of the second valve to a tap on said voltage divider.

No references cited.

ROY LAKE, *Primary Examiner.*

E. C. FOLSOM, *Assistant Examiner.*